United States Patent
Nakamura et al.

(10) Patent No.: US 10,244,639 B2
(45) Date of Patent: Mar. 26, 2019

(54) METHOD OF MANUFACTURING STACKED MOUNTING STRUCTURE

(71) Applicant: OLYMPUS CORPORATION, Tokyo (JP)

(72) Inventors: Mikio Nakamura, Hinodemachi (JP); Yu Kondo, Yamato (JP)

(73) Assignee: OLYMPUS CORPORATION, Tokyo (JP)

( * ) Notice: Subject to any disclaimer, the term of this patent is extended or adjusted under 35 U.S.C. 154(b) by 781 days.

(21) Appl. No.: 13/668,982

(22) Filed: Nov. 5, 2012

(65) Prior Publication Data
US 2013/0133190 A1 May 30, 2013

Related U.S. Application Data

(62) Division of application No. 12/678,855, filed as application No. PCT/JP2008/066655 on Sep. 16, 2008, now abandoned.

(30) Foreign Application Priority Data

Sep. 18, 2007 (JP) .................................. 2007-240785
Mar. 31, 2008 (JP) .................................. 2008-091636

(51) Int. Cl.
*H05K 1/14* (2006.01)
*H05K 3/46* (2006.01)
(Continued)

(52) U.S. Cl.
CPC ............. *H05K 3/368* (2013.01); *H01L 24/19* (2013.01); *H01L 25/0657* (2013.01);
(Continued)

(58) Field of Classification Search
CPC ............... H05K 3/4046; H05K 3/4647; H05K 2201/0367; H05K 3/368;
(Continued)

(56) References Cited

U.S. PATENT DOCUMENTS 5,334,804 A * 8/1994 Love .................... H01L 21/486
174/257
6,222,259 B1 4/2001 Park et al.
(Continued)

FOREIGN PATENT DOCUMENTS

JP 05102149 A * 4/1993
JP 2000323806 A 11/2000
(Continued)

OTHER PUBLICATIONS

Machine Translation of JP05102149A, obtained on Jul. 17, 2015.*
(Continued)

*Primary Examiner* — Livius Radu Cazan
(74) *Attorney, Agent, or Firm* — Scully, Scott, Murphy & Presser, P.C.

(57) ABSTRACT

A stacked mounting structure and a method of manufacturing stacked mounting structure are provided. The stacked mounting structure includes a plurality of members provided with a mounting area which is necessary for installing and operating components to be mounted on at least one principal surface, and an area for connections for signal transfer for operating the components to be mounted, and an electroconductive member which is disposed on the area for connections between the mutually facing members, and a cross section of the electroconductive member is same as or smaller than the area for connections, and an end portion of the electroconductive member is extended from a principal surface of one member up to a principal surface of the other member, and a height of the electroconductive member regulates a distance of the mounting area.

3 Claims, 12 Drawing Sheets

(51) Int. Cl.
*H05K 3/40* (2006.01)
*H05K 3/36* (2006.01)
*H01L 25/065* (2006.01)
*H01L 25/10* (2006.01)
*H01L 23/00* (2006.01)
*H05K 3/28* (2006.01)
*H05K 3/34* (2006.01)
*H01L 21/56* (2006.01)
*H01L 23/31* (2006.01)

(52) U.S. Cl.
CPC .......... H01L 25/105 (2013.01); H05K 1/144 (2013.01); H05K 3/4046 (2013.01); H05K 3/4647 (2013.01); *H01L 21/56* (2013.01); *H01L 23/3121* (2013.01); *H01L 2224/04105* (2013.01); *H01L 2224/12105* (2013.01); *H01L 2224/274* (2013.01); *H01L 2225/0652* (2013.01); *H01L 2225/06541* (2013.01); *H01L 2225/1023* (2013.01); *H01L 2225/1035* (2013.01); *H01L 2225/1058* (2013.01); *H01L 2924/0002* (2013.01); *H01L 2924/01079* (2013.01); *H05K 3/284* (2013.01); *H05K 3/3426* (2013.01); *H05K 3/3436* (2013.01); *H05K 2201/042* (2013.01); *H05K 2201/10242* (2013.01); *H05K 2201/10318* (2013.01); *H05K 2203/025* (2013.01); *H05K 2203/1316* (2013.01); *Y10T 29/4913* (2015.01); *Y10T 29/49117* (2015.01); *Y10T 29/49147* (2015.01)

(58) Field of Classification Search
CPC .......... H05K 2201/10318; H05K 1/144; Y10T 29/4913; Y10T 29/49147
See application file for complete search history.

(56) References Cited

U.S. PATENT DOCUMENTS

| | | | |
|---|---|---|---|
| 6,448,106 B1 | 9/2002 | Wang et al. | |
| 7,129,110 B1 * | 10/2006 | Shibata | H01L 21/56 |
| | | | 257/E21.502 |
| 7,521,283 B2 | 4/2009 | Machida et al. | |
| 2006/0284309 A1 | 12/2006 | Park et al. | |

FOREIGN PATENT DOCUMENTS

| | | | | |
|---|---|---|---|---|
| JP | 2001-110829 | | 4/2001 | |
| JP | 2001-144399 | | 5/2001 | |
| JP | 2001-196498 A | | 7/2001 | |
| JP | 2002-134653 A | | 5/2002 | |
| JP | 2002-359350 A | | 12/2002 | |
| JP | 2006-165252 A | | 6/2006 | |
| JP | 2007-27526 A | | 2/2007 | |
| JP | 3960479 | | 5/2007 | |
| JP | 2007-189187 A | | 7/2007 | |
| JP | 3960479 B1 * | 8/2007 | ............ H01L 25/16 |
| JP | 2008016729 A * | 1/2008 | |

OTHER PUBLICATIONS

English Language Abstract Only of JP 2008-016729 published Jan. 24, 2008 (Corresponding to JP 3960479).
International Search Report dated Dec. 16, 2008 of corresponding International Application No. PCT/JP2008/066655.
Extended Supplementary European Search Report dated Sep. 3, 2010 of corresponding Application No./Patent No. 08832607.9-2203 / 2194576 PCT/JP2008066655.
U.S. Non-Final Office Action dated Jul. 3, 2012 of corresponding U.S. Appl. No. 12/678,855.
European Office Action dated Mar. 7, 2014 received in corresponding Application No. 08 832 607.9-1552.
European Patent Convention Communication dated May 19, 2015, from corresponding European Application No. 08 832 607.9.

* cited by examiner

METHOD OF MANUFACTURING STACKED MOUNTING STRUCTURE

CROSS REFERENCE TO RELATED APPLICATIONS

This application is a Divisional application of U.S. Ser. No. 12/678,855 filed on Mar. 18, 2010, now abandoned, which is a national stage application under PCT/JP2008/066655 filed on Sep. 16, 2008, which claims the benefit of priority to JP 2007-240785 filed on Sep. 18, 2007 and JP 2008-091636 filed on Mar. 31, 2008, the contents of each of which are incorporated herein by reference.

TECHNICAL FIELD

The present invention relates to a stacked mounting structure and a method of manufacturing stacked mounting structure.

BACKGROUND ART

As a substrate connecting member which connects electronic circuit boards which are stacked, a substrate connecting member described in Patent Literature 1 (Japanese Patent Application Laid-open Publication No. 2001-144399) is available. This substrate connecting member is a member which covers a core body made of a stiff conductor by an elastic body, and which covers the surrounding of the elastic body by an electroconductive material. By structuring the substrate connecting member in such manner, there is an effect that heating is not necessary to separate the electronic circuit board at the time of a repairing job.

Moreover, as another conventional example, for realizing a small and a highly dense substrate in which electronic components are built-in, a structure in which, electrodes of the electronic components are exposed by carrying out a process of grinding and perforating on a resin after the electronic components are fixed by resin in a through hole in a circuit-board main body, and further, a circuit layer is formed on a front and a rear surface of the circuit-board main body, has been proposed.

Patent Literature 1: Japanese Patent Application Laid-open Publication No. 2001-144399

DISCLOSURE OF INVENTION

Technical Problem

However, although narrowing of pitch was possible in the substrate connecting member described in Patent Literature 1, there were following problems. In other words, (1) stacked electronic circuit boards were supposed to be attached and detached mutually, (2) assembling and position adjustment in a recess in a case of forming a plurality of connecting members have been difficult, (3) stacking of a multiple number of electronic circuit boards has not been taken into consideration, and (4) at least two members namely the core body and the elastic body being necessary, small sizing had been difficult.

Moreover, in the another conventional example mentioned above, the electronic components which can be built-in in a substrate thickness were restricted to components having a height smaller than the substrate thickness, and also, the circuit layer on the front and rear surface of the board main body had to be connected via the electronic components, due to which there had been substantial restrictions in designing of the circuit layer. In a case of connecting the circuit layer on the front and rear surface of the board main body upon bypassing the electronic components, the connections can be made via a through hole, but it is necessary to provide an electrode pad (land electrode) larger than a through-hole diameter, and since the narrowing of pitch of the board connecting portion was difficult, there had been limitations on making small an area of a principal surface of the substrate.

The present invention has been made in view of the abovementioned circumstances, and an object of the present invention is to provide a stacked mounting structure in which, it is possible to realize the narrowing of pitch and to secure a height which enables to mount components, and a method of manufacturing stacked mounting structure. Moreover, another object of the present invention is to provide a stacked mounting structure in which, a degree of freedom of wiring of the substrate is high, and the narrowing of pitch of the substrate connecting portions is possible, and accordingly, the area of the principal surface of the substrate is small.

Technical Solution

To solve the abovementioned problems and to achieve the object, the stacked mounting structure of the present invention includes a plurality of members provided with a mounting area which is necessary for installing an operating components to be mounted on at least one principal surface, and an area for connections for signal transfer for operating the components to be mounted, and an electroconductive member which is disposed on the area for connections between the mutually facing members, and a cross-section of the electroconductive member is same as or smaller than the area for connections, and an end portion of the electroconductive member is extended from a principal surface of one member up to a principal surface of the other member, and a height of the electroconductive member regulates a distance of the mounting area.

In the stacked mounting structure of the present invention, it is preferable that a reinforcing member is installed around the electroconductive member.

In the stacked mounting structure of the present invention, it is desirable that the components to be mounted are mounted on the mounting area, and a distance of the mounting area between the plurality of members is more than a height of the components to be mounted.

In the stacked mounting structure of the present invention, it is preferable that the reinforcing member is filled in the mounting area between the mutually facing members.

In the stacked mounting structure of the present invention, it is preferable that the electroconductive member is rod-shaped.

In the stacked mounting structure of the present invention, it is desirable that the electroconductive member, in a state of one end portion thereof joined, the other end portion is mounted on the member, and is formed by removing the portion joined after the other end portion is mounted on the member.

In the stacked mounting structure of the present invention, it is preferable that an electroconductive pattern of which, at least a part is electrically connected to the electroconductive member, is formed at one end portion of the reinforcing member.

Moreover, a method of manufacturing stacked mounting structure includes steps of:

mounting components to be mounted, and mounting an electroconductive member which is higher than a height of the components to be mounted, on a first member, a reinforcing step of forming a reinforcing member around the electroconductive member on the first member by exposing an end portion of the electroconductive member, at an opposite side of the first member, and at the reinforcing step, a surface of the reinforcing member, opposite to the first member is flattened by grinding, and an end portion of the electroconductive member is exposed.

In the method of manufacturing stacked mounting structure of the present invention, it is desirable that the method of manufacturing stacked mounting structure further includes a joining step of forming one end portion of the electroconductive member, in a state of the plurality of electroconductive members joined.

In the method of manufacturing stacked mounting structure of the present invention, it is preferable that the method of manufacturing stacked mounting structure includes steps of: forming a metal film on an end-portion surface of the electroconductive member which is exposed, after the reinforcing member is formed by exposing the end portion of the electroconductive member, on the opposite side of the first member, and a step of forming a bump on the metal film of the end-portion surface of the electroconductive member.

In the method of manufacturing stacked mounting structure of the present invention, it is preferable that the method of manufacturing stacked mounting structure includes a separating step after an insulating-material forming step, and that the first member has a size equivalent to a plurality of modules.

According to the stacked mounting structure and the method of manufacturing stacked mounting structure of the present invention, there is shown an effect that it is possible to provide a stacked mounting structure in which, it is possible to realize a narrowing of pitch and to secure a height, which enables to mount components to be mounted, and a method of manufacturing stacked mounting structure.

EXPLANATION OF REFERENCE

Figure 1:
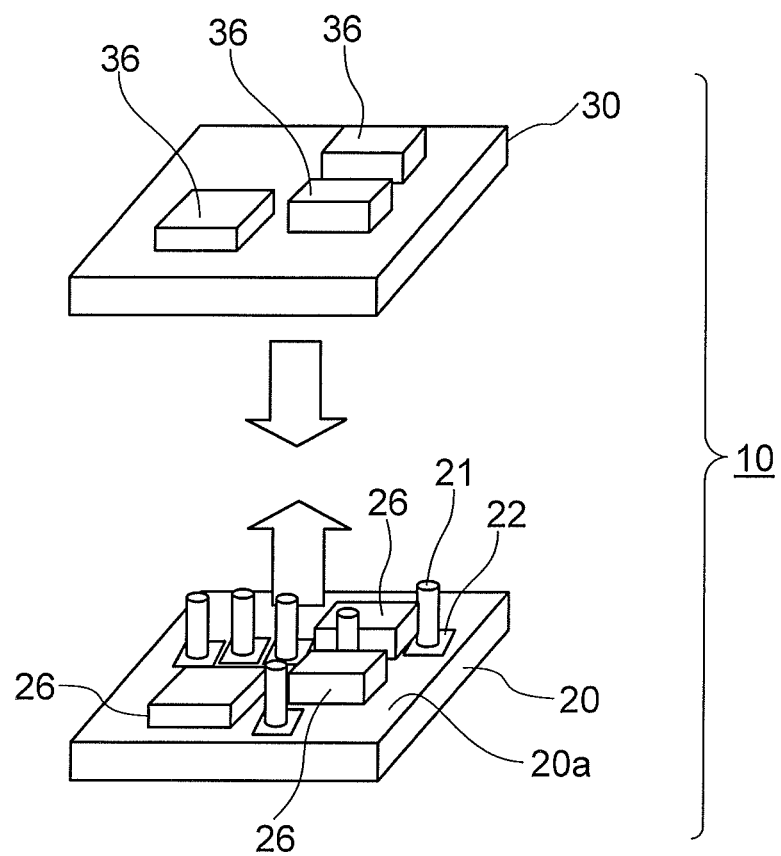
FIG. 1 is perspective view showing a structure of a stacked mounting structure according to a first embodiment, by separating into a first substrate and a second substrate.

10 stacked mounting structure
20 first substrate
20*a* principal surface
21 electroconductive member
21*a* end portion
22 electrode
23 insulating layer
23*a* upper surface
24 circuit layer
26 electronic component
29 bump
30 second substrate
32 electrode
34 circuit layer
36 electronic component
40 stacked mounting structure
50 first substrate
51 electroconductive member
52 electrode
56 electronic component
57 reinforcing member
60 second substrate
66 electronic component
70 stacked mounting structure
80 first substrate
81 electroconductive member
83 insulating layer
88 wire
90 module

BEST MODE FOR CARRYING OUT THE INVENTION

Exemplary embodiments of a stacked mounting structure and a method of manufacturing stacked mounting structure according to the present invention will be described below in detail by referring to the accompanying diagrams. However, the present invention is not restricted to the embodiments described below.

In the method of manufacturing stacked mounting structure according to the present invention, components to be mounted are mounted on a circuit board and at the same time, from among these components to be mounted, an electroconductive member which is longer than a component having the maximum height is connected upon fixing in perpendicular with the substrate, to an electrode on the circuit board, and after filling a resin in a gap between the electroconductive member and the component to be mounted, only a head portion of the electroconductive member is exposed by grinding. By connecting a second substrate to the electroconductive member exposed, or, by forming a circuit by printing on a ground surface, the upper and the lower circuit boards are connected and fixed electrically and mechanically, and accordingly, the stacked mounting structure according to the present invention is formed. Concrete embodiments will be described below.

First Embodiment

FIG. 1 is a perspective view showing a structure of a first embodiment of a stacked mounting structure according to the present invention, by separating into a first substrate 20 and a second substrate 30.

As shown in FIG. 1, electronic components 26 are mounted on a principal surface of the first substrate 20. Moreover, electronic components 36 are mounted on the second substrate 30. The first substrate 20 and the second substrate 30 are disposed face-to-face. A multi-layer substrate or a substrate with built-in electronic components may be used for the first substrate 20 and the second substrate 30.

Electrodes 22 are provided between the electronic components 26 of the first substrate 20, and electroconductive members 21 having a substantially circular cylindrical shape are installed on the electrodes 22. A length of all the electroconductive members 21 is substantially same, and is longer than the maximum height of the electronic component 26 from among the electronic components 26 mounted on the first substrate 20. Moreover, an area of an orthogonal cross-section perpendicular to a longitudinal direction of the electroconductive member 21 is same as or less than an area of the electrodes 22.

The electroconductive member 21 can be made easily by cutting out from a wire, when a circular cylindrical shaped component is used. At this time, when a diameter of an end portion of a side of the electroconductive portion 21, to be mounted on the first substrate 20 is made substantial, the mounting on the first substrate 20 can be carried out easily and assuredly. Whereas, an end portion of the electroconductive member, on the opposite side of the first substrate 20 can also be mounted in a state of a number of electroconductive members joined.

For the electroconductive member 21, it is preferable to use a material having a lower electrical resistance (such as Cu (copper)). Moreover, it is preferable to apply Au (gold) plating on a surface of the electroconductive member 21 for preventing oxidation of a base material. Furthermore, a surface treatment for making soldering easy is carried out on the electroconductive member 21, and one end portion of the electroconductive member 21, and the electrode 22 are joined to be electroconductive by soldering. Instead of soldering, it is possible to bring into electrical conduction by contact conduction by a method such as an ACP method in which, an anisotropic conductive material is used, an ACF method, and an NCP method.

Figure 2:
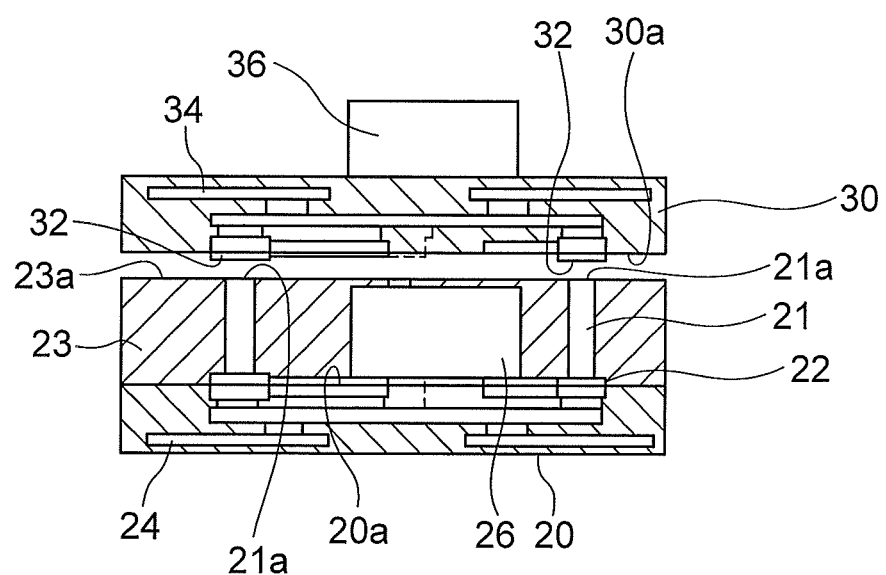
FIG. 2 is a cross-sectional view showing a structure of the stacked mounting structure according to the first embodiment.

As shown in FIG. 2, circuit layers 24 and 34 are formed in the first substrate 20 and the second substrate 30 respectively. An insulating layer 23 is formed by filling and curing an insulating material (reinforcing member) of a resin around the electroconductive member 21 and the electronic components 26 on the first substrate 20. In the insulating layer 23, only an end portion 21a of the electroconductive member 21, toward the second substrate 30 is exposed from a surface (an upper surface) 23a toward the second substrate 30.

Electrodes 32 are installed on a surface 30a of the second substrate 30, facing the first substrate 20, at positions facing the electroconductive members 21. The second substrate 30 is joined to a surface of the insulating surface 23 such that the end portions 21a of the electroconductive members 21 of the first substrate 20 and the electrodes 32 are connected electrically. The number of stacked layers may be increased further by installing electroconductive members (not shown in the diagram) on electrodes (not shown in the diagram) on the exposed surface of the second substrate 30.

In the first embodiment, since the electroconductive member connecting the upper and the lower circuit boards can be installed freely between the electronic components, a wiring design of each substrate is not constrained. Furthermore, the electrode on which the electroconductive member is mounted not being a through hole electrode, a land electrode is not necessary, and the electroconductive members can be disposed at a narrow pitch. Therefore, it is possible to provide a stacked mounting structure having a small area of a principal surface of a substrate. Moreover, since processes such as cutting of through holes and recesses in the substrate are not necessary, it is possible to provide a stacked mounting structure at a low price and having a small area of the principal surface of the substrate.

Second Embodiment

Figure 3:
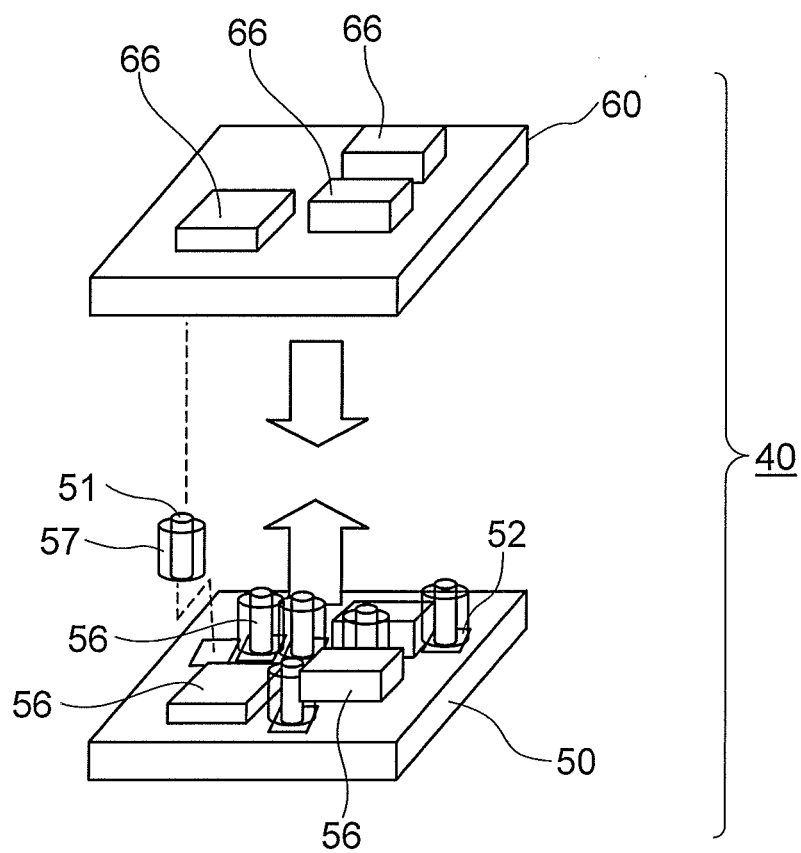
FIG. 3 is a perspective view showing a structure of a stacked mounting structure according to a second embodiment, by separating into a first substrate and a second substrate.
Figure 4:
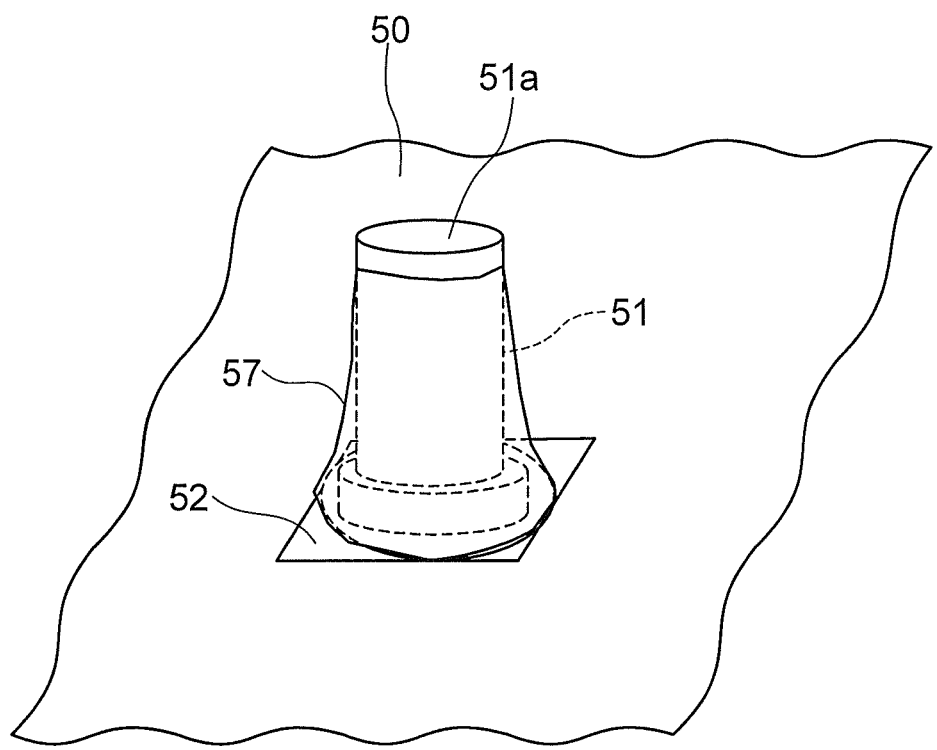
FIG. 4 is an enlarged perspective view showing a relationship of an electroconductive member and a reinforcing member according to the second embodiment.

FIG. 3 is a perspective view showing a structure of a second embodiment of a stacked mounting structure according to the present invention, by separating into a first substrate 50 and a second substrate 60. FIG. 4 is an enlarged perspective view showing a relationship of an electroconductive member and a reinforcing member according to the second embodiment.

The second embodiment differs from the first embodiment at a point that, a reinforcing member 57 is formed in a state of a part or whole of a mounting area exposed around an electroconductive member 51. In other words, the first substrate 20, the electrode 22, the electronic component 26, the second substrate 30, the electronic component 36 in the stacked mounting structure 10 of the first embodiment correspond to the first substrate 50, the electroconductive member 51, an electrode 52, an electronic component 56, the second substrate 60, and an electronic component 66 respectively in a stacked mounting structure 40 of the second embodiment. Moreover, although it is not shown in the diagram, even in the stacked mounting structure of the second embodiment, a circuit layer similar to the circuit layers 24 and 34 of the stacked mounting structure 10 of the first embodiment is formed.

In the second embodiment, the electronic components being exposed after forming the reinforcing member, the electronic components can be checked immediately before connecting the second substrate, and the number of defective stacked mounting structures can be reduced.

As shown in FIG. 4, the reinforcing member 57 is disposed such that an end portion 51a toward the second substrate 60 is left around the electroconductive member 51. As the reinforcing member 57, a material which is in a liquid form at the time of disposing around the electroconductive member 51, and which is hardened after disposing is to be used.

Third Embodiment

Figure 5:
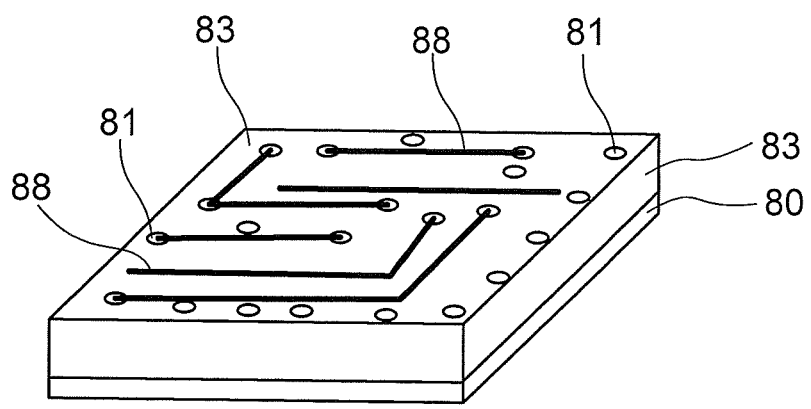
FIG. 5 is a perspective view showing a structure of a stacked mounting structure according to a third embodiment.

FIG. 5 is a perspective view showing a structure of a third embodiment of a stacked mounting structure according to the present invention.

In a stacked mounting structure 70 of the third embodiment, similarly as the insulating layer 23 of the first embodiment, an insulating layer 83 by an insulating material of a resin is formed around electronic components (not shown in the diagram) and electroconductive members 81 on a first substrate 80, and on a surface of the insulating layer 83, which is far from the first substrate 80, wires 88 are formed to connect the electroconductive members 81. In other words, in the third embodiment, without placing a second substrate such as the second substrate 30 of the first embodiment and the second substrate 60 of the second embodiment, the wires 88 are formed directly on the insulating layer 83. As a method for forming the wires 88, a method such as plating, sputtering, vapor deposition, and printed wiring by an ink-jet or dispensing may be used. By letting the structure to be such structure, since a substrate portion of the second substrate is not necessary, it is possible to improve a degree of freedom of designing, and to provide a stacked mounting structure with a low stacking height, and small area of a principal surface of the substrate.

(Modified Embodiments)

Next, modified embodiments of the stacked mounting structure will be described below. FIG. 11A, FIG. 11B, FIG. 11C, and FIG. 11D show structures of stacked mounting structures according to the modified embodiments.

Figure 11A:
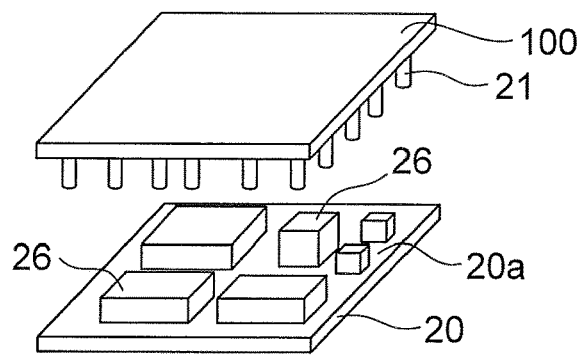
FIG. 11A is a perspective view showing a structure of a stacked mounting structure according to a modified embodiment.

As it has been mentioned above, the end portion of the electroconductive member 21 toward the opposite side of the first substrate 20 can be mounted in the state of the number of electroconductive members 21 joined. The state of the number of electroconductive members 21 joined can be formed by forming the electroconductive members 21 by plating of Cu on a substrate 100, or by carrying out press working on a plate 100 of an electroconductive material such as Cu (FIG. 11A).

Figure 11B:
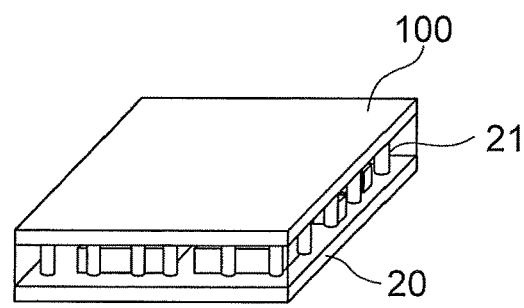
FIG. 11B is another perspective view showing the structure of the stacked mounting structure according to the modified embodiment.
Figure 11C:
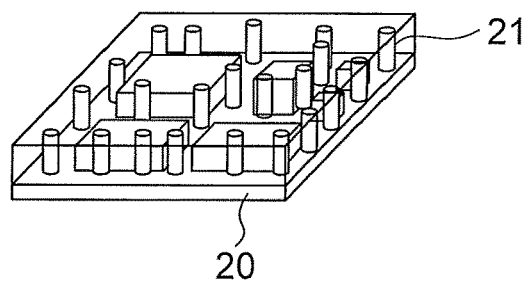
FIG. 11C is still another perspective view showing the structure of the stacked mounting structure according to the modified embodiment.

In this embodiment, an electroconductive member 21 which is connected is prepared separately from the first substrate 20, and is connected to the first substrate 20. FIG. 11B shows a state of a pin-substrate joining. Moreover, as shown in FIG. 11C, a resin is applied between a portion where the first substrate 20 and the electroconductive members 21 are joined, and cured. Here, a resin may be applied in advance on the first substrate 20.

Figure 11D:
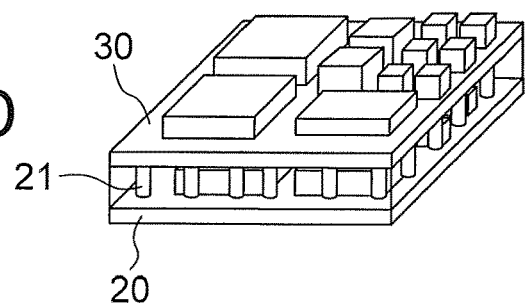
FIG. 11D is another perspective view showing the structure of the stacked mounting structure according to the modified embodiment.

The portion at which, the substrate 100 and the electroconductive members 21 are joined is removed by grinding, and each electroconductive member 21 is exposed. A metal film which prevents oxidation of the electroconductive member 21 is formed at the end portion of the exposed electroconductive members 21. Finally, the second substrate 30 is stacked as shown in FIG. 11D, and the substrates 20 and 30 are connected. Accordingly, the stacked mounting structure is formed. Therefore, in a case in which, the height of the electronic component 26 is comparatively high such as from 0.3 mm to 1 mm, by disposing freely the electroconductive members 21 longer than the height of the electronic component 26 on a principal surface 20a of the first substrate 20, it is possible to connect the first substrate 20 and the second substrate 30. Moreover, it is possible to narrow a pitch of connections.

In such manner, the electroconductive members 21 are mounted collectively on the first substrate 20 in the state of the plurality of one end portions joined. Therefore, it is possible to mount the electroconductive members 21 easily. Moreover, since protruding electrodes can be prepared collectively, further narrowing of pitch is possible. As a result, the stacked mounting structure can be easily manufactured to be small.

Figure 6:
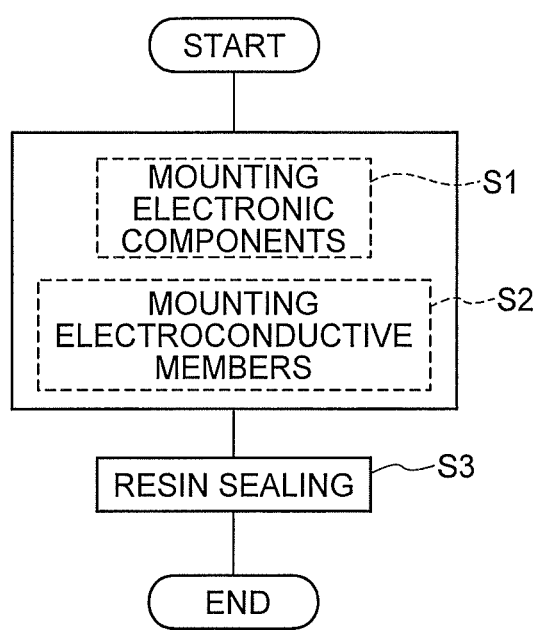
FIG. 6 is a flowchart showing a flow of a method of manufacturing stacked mounting structure according to a fourth embodiment.

Next, a method of manufacturing stacked mounting structure according to the present invention will be described below by citing embodiments from a fourth embodiment to a sixth embodiment Fourth Embodiment FIG. 6 is a flowchart showing a flow of a method of manufacturing stacked mounting structure according to the fourth embodiment. The method of manufacturing of the fourth embodiment is applicable to embodiments from the first embodiment to the third embodiment, and the modified embodiments, and in the description of the embodiments from the fourth embodiment to the sixth embodiment, reference numerals of the first embodiment are used.

Firstly, the electronic components 26 are mounted on the first substrate 20 (step S1), and at the same time, the electroconductive members 21 are mounted on the electrodes 22 of the first substrate 20 (step S2). For mounting the electronic components 26, a prevalent surface mounting process may be used. Moreover, in a case of mounting the electroconductive members 21 by soldering, the electroconductive members 21 can be mounted by a method in which, a cream solder and flux are supplied on the electrodes 22 by a method such as printing, and the electroconductive members are positioned and fixed on the electrodes 22 by using a mounting instrument and jig, and heated. For mounting the electronic components 26 and the electroconductive members 21 on the first substrate 20, the electroconductive members 21 may be mounted after the electronic components 26 are mounted (refer to the fifth embodiment or the sixth embodiment), or vice versa.

Next, the insulating layer 23 is formed around the electronic components 26 and the electroconductive members 21 on the first substrate 20 by applying a liquid sealing resin on the first substrate 20 on which the electronic components 26 and the electroconductive members 21 are mounted such that, the end surface 21a on the opposite side of the first substrate 20 (toward the second substrate 30) is exposed, and then curing the liquid sealing resin. Accordingly, the electroconductive members 21 and the electronic components 26 are sealed (step S3). As a curing method of resin, methods such as a thermal curing and two-liquid mixing are available. The shape of the resin after curing can be set easily by using a mould which is matched with an outer shape of the first substrate 20 or a desired shape after curing. In a case of applying the fourth embodiment to the second embodiment, at step S3, instead of sealing of a resin, a reinforcing member is to be disposed around the electroconductive members.

Thereafter, the second substrate 30 is connected by stacking on the first substrate 20 via the bump in the form of a metal film formed on an end surface of the electroconductive member 21, on the opposite side of the first substrate 20. In a case of applying the fourth embodiment to the third embodiment, without stacking the second substrate 30, wires are formed directly on a surface 23a of the insulating layer 23, on the opposite side of the first substrate 20.

The stacked mounting structure being manufactured by the abovementioned steps, it is possible to provide the stacked mounting structure having a small area of a principal surface of the substrate by extremely less number of steps.

Fifth Embodiment

Figure 7:
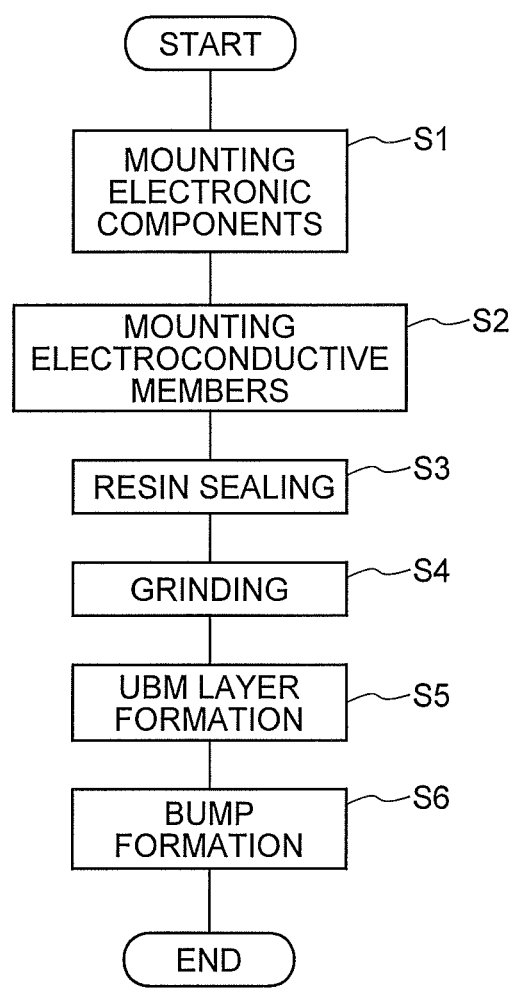
FIG. 7 is a flowchart showing a flow of a method of manufacturing stacked mounting structure according to a fifth embodiment.

FIG. 7 is a flowchart showing a flow of a method of manufacturing stacked mounting structure according to a fifth embodiment. In the fifth embodiment, steps of mounting electronic components (step S1), mounting electroconductive members (step S2), and resin sealing (step S3) being same as in the fourth embodiment, the description of these steps is omitted.

After the resin sealing (step S3), the upper surface 23a of the insulating layer 23 is ground and flattened to be parallel to the principal surface 20a of the first substrate 20, as well as, each of the end surfaces 21a of the electroconductive members 21, on the opposite side of the first substrate 20 is exposed (step S4).

Next, a metal film (UBM layer) is formed on the end surface 21a of the exposed electroconductive member 21 (step S5). By forming the metal layer, it is possible to prevent oxidation of the electroconductive member 21, and the electric resistance at the time of bump formation, which is the subsequent step, being low, it is possible to form a bump having a high strength.

Next, the bump is formed on the metal film which is formed on the end surface 21a of the exposed electroconductive member 21 (step S6). Solder or gold can be used as a material of bump.

Thereafter, the second substrate 30 is connected by stacking via a bump 29 (FIG. 9 and FIG. 10) on the metal film which is formed on the end surface 21a of the electroconductive member 21.

By manufacturing the stacked mounting structure by such method, since the upper surface 23a of the insulating layer 23 is flattened, and assuredly becomes parallel to the principal surface 20a of the first substrate 20, the end surface 21a of the electroconductive member 21 has a structure which makes it easy to connect the second substrate 30. Consequently, it is possible to provide a stacked mounting structure having a high quality of connection of the first substrate 20 and the second substrate 30, and small area of the principal surface of the substrate.

Sixth Embodiment

Figure 8:
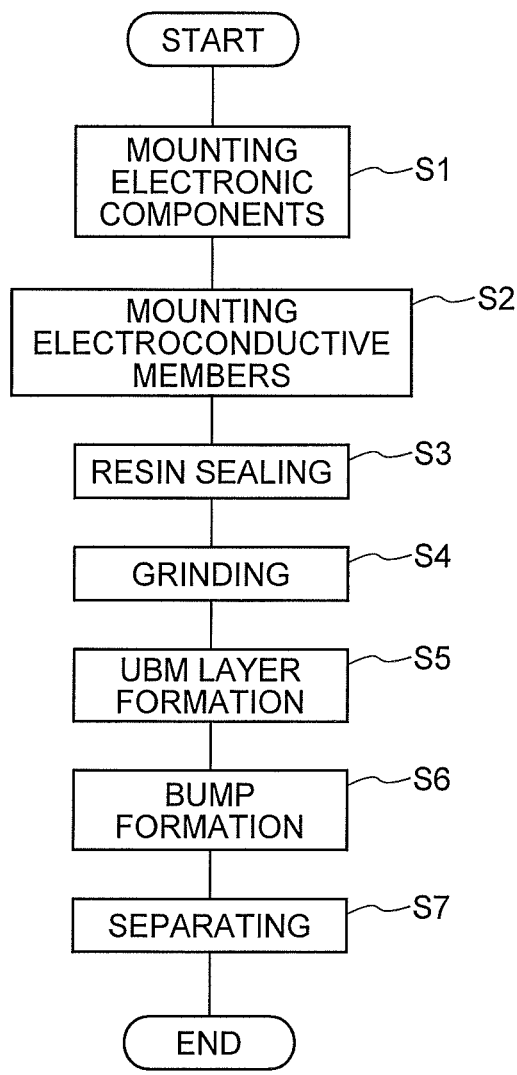
FIG. 8 is a flowchart showing a flow of a method of manufacturing stacked mounting structure according to a sixth embodiment.
Figure 9:
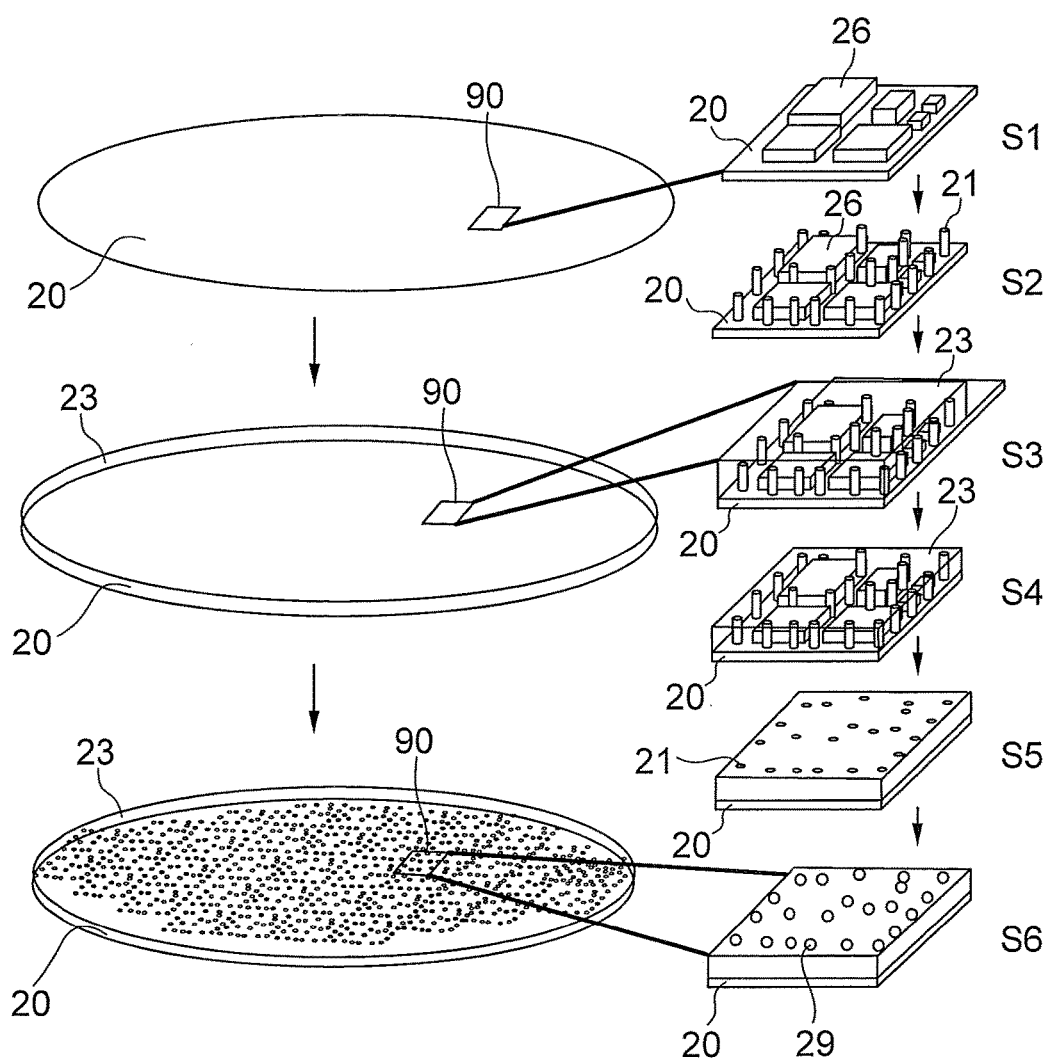
FIG. 9 is a diagram of which, a right side is an enlarged perspective view showing a structure of a stacked mounting structure corresponding to steps from step S1 to step S6 in FIG. 8, and a left side is a perspective view showing an assembled state of the stacked mounting structure separated into pieces in the right-side diagram.
Figure 10:
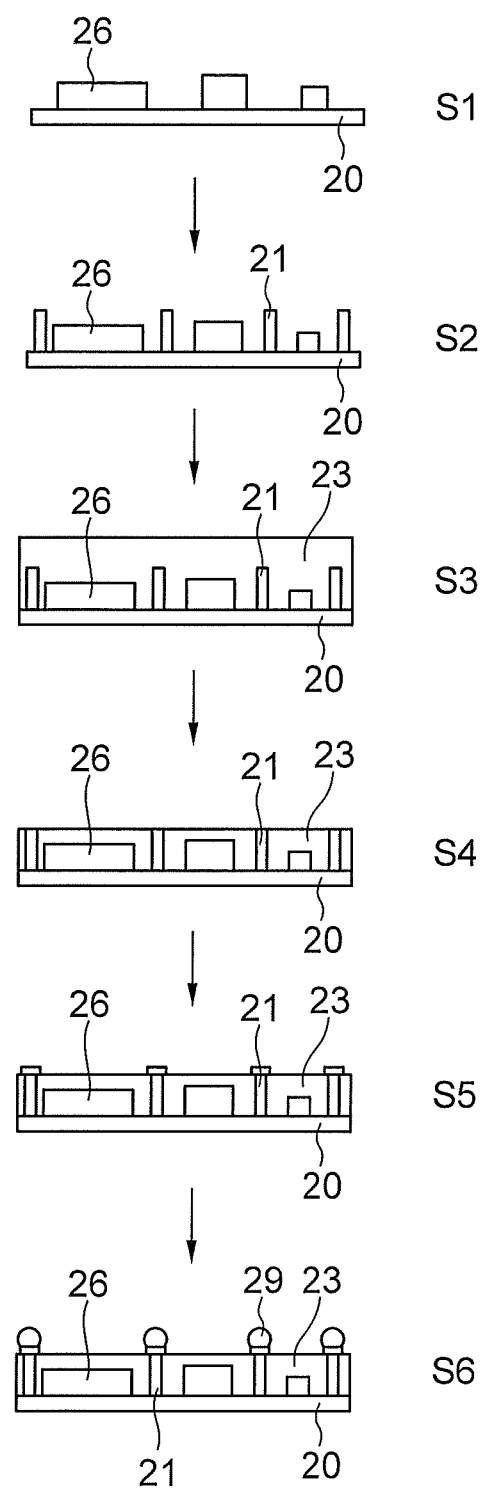
FIG. 10 is a side view showing a structure of the stacked mounting structure corresponding to steps from step S1 to step S6 in FIG. 8.

FIG. 8 is a flowchart showing a flow of a method of manufacturing stacked mounting structure according to a sixth embodiment. FIG. 9 is a diagram of which, a right side is an enlarged perspective view showing a structure of a stacked mounting structure corresponding to steps from Step S1 to step S6 in FIG. 8, and left side is a perspective view showing an assembled state of the stacked mounting structure separated into pieces in the right-side diagram. FIG. 10 is a side view showing a structure of the stacked mounting structure corresponding to steps from step S1 to step S6 in FIG. 8.

In the sixth embodiment, steps of mounting electronic components (step S1), mounting electroconductive members (step S2), resin sealing (step S3), grinding (step S4), UBM layer formation (step S5), and bump formation (step S6) are same as in the fifth embodiment. After forming the bump 29, a plurality of modules 90 is formed on the first substrate 20, and by a step of separating such as dicing, the modules are turned to be individual modules (step S7).

According to such method of manufacturing, since it is possible to prepare a plurality of modules at a time, it is possible to provide a stacked mounting structure in which, the cost of manufacturing modules is low and the area of the principal surface of the substrate is small.

(Modified Embodiments)

Figure 12:
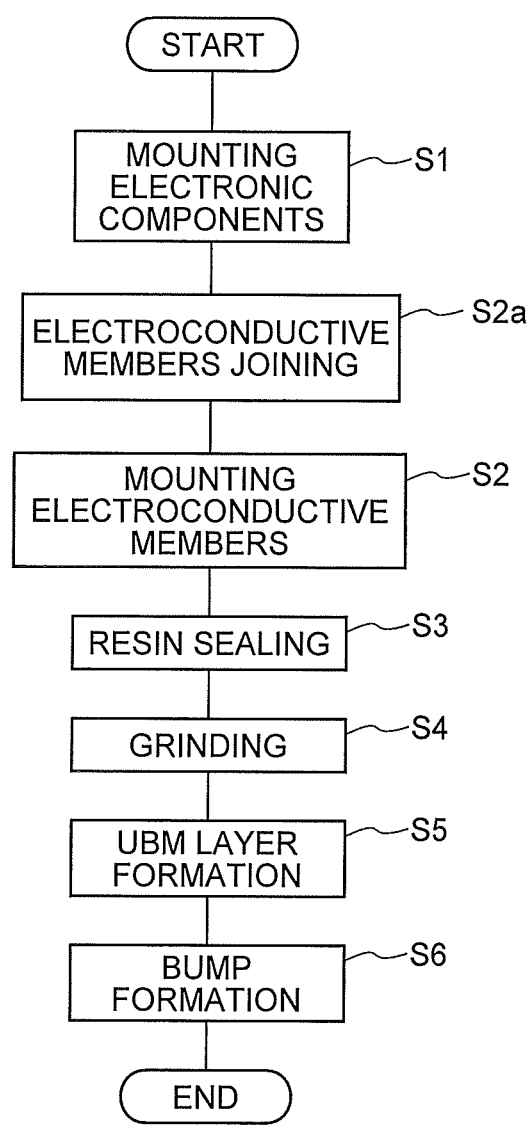
FIG. 12 is a flow chart showing a flow of a method of manufacturing stacked mounting structure according to a modified embodiment.

FIG. 12 is a flow chart showing a flow of a method of manufacturing stacked mounting structure according to a modified embodiment. Same reference numerals are assigned to contents which are same as the steps of the embodiments described above, and repeated description of such steps is omitted. To start with, in this modified embodiment, firstly, the electronic components 26 are mounted on the first substrate 20 (step S1).

Cu is grown by plating on a substrate 100, at positions facing electrodes provided between the electronic components 26 of the first substrate 20. Accordingly, a state in which, one end portions of some of the electroconductive members 21 are connected is formed (step S2a).

For the state in which, the one end portions of the electroconductive members 21 are connected, various methods such as forming Cu by plating on the substrate 100, furthermore, forming the electroconductive members 21 by a method such as press working on a plate 100 of an electroconductive material such as Cu, and plating the end surfaces in a state of the rod-shaped electroconductive members 21 arranged to be aligned on a jig, can be used. The electroconductive members 21 are formed such that the height of the electroconductive member 21 is more than the height of the electronic component 26.

The end portion of the electroconductive member 21, on the side which is not connected, is joined to the electrode of the principal surface 20a of the first substrate 20 (step S2). In a state of the one end portion of the electroconductive member 21 joined, when Au plating is applied on a surface thereof, oxidation of Cu is prevented and the soldering can be carried out assuredly.

A resin is applied between portions at which, the first substrate 20 and the electroconductive members 21 are joined, and cured (step S3). Here, the resin may be applied in advance on the first substrate 20.

A portion at which the substrate 100 and the electroconductive members 21 are joined is removed by grinding, and each electroconductive member 21 is exposed (step S4). Surrounding of the electroconductive member 21 is reinforced by resin. Therefore, the electroconductive member 21 can be ground stably. Furthermore, the height (length) of the electroconductive members 21 can be arranged precisely by grinding. Therefore, a tolerance of length of the electroconductive member 21 to be used can be widened.

When the height of the electronic components 26 is comparatively high such as from 0.3 mm to 1 mm, the electroconductive member 21 longer than the height of the electronic components 26 can be disposed freely on the principal surface 20a of the first substrate 20, and the first substrate 20 and the second substrate 30 can be joined. Moreover, pitch of connections can be narrowed.

Thereafter, a metal film which prevents oxidation of the electroconductive member 21 is formed on the end portions of the exposed electroconductive members 21. Next, by connecting the second substrate 30, the stacked mounting structure is formed.

In such manner, the electroconductive members 21 are mounted on the first substrate 20 in the state of the plurality of one end portions joined. Therefore, the electroconductive members 21 can be mounted easily. Moreover, since protruding electrodes can be prepared collectively, further narrowing is possible. As a result, the stacked mounting structure can be easily manufactured to be small.

As it has been described above, according to the present invention, since the electroconductive members, which connect the upper and the lower circuit boards can be disposed freely between the electronic components, wiring design of each substrate is not constrained. Furthermore, the electrodes on which, the electroconductive members are mounted not being through-hole electrode, land electrodes are not required, and the electroconductive members can be disposed with a narrow pitch. Therefore, it is possible to provide a stacked mounting structure having a small area of the principal surface of the substrate.

INDUSTRIAL APPLICABILITY

In such manner, the stacked mounting structure and the method of manufacturing stacked mounting structure according to the present invention are useful for small sizing of a mounting structure main body, and particularly, are appropriate for highly dense mounting of an image picking unit at a front end of an endoscope.

The invention claimed is:

1. A method of manufacturing a stacked mounting structure, the method comprising:

mounting components on a surface of a first substrate;

positioning one end portions of each of a plurality of electroconductive members to be joined to a second substrate using a jig for holding each of the plurality of electroconductive members in a predetermined position, a height of each of the plurality of electroconductive members being greater than a height of the components;

forming a conductive plating on each of the one end portions of the plurality of electroconductive members in a state of being positioned by the jig;

subsequent to the mounting, positioning and forming, joining the one end portion of each of the plurality of electroconductive members to the second substrate in the state of being positioned in the predetermined position by the jig;

mounting an other end portion of the plurality of electroconductive members on the surface of the first substrate, wherein the first and second substrates are disposed offset from each other with the electroconductive members disposed therebetween such that the one end portion is joined to the second substrate and the other end portion is joined to the first substrate;

forming a reinforcing member around the plurality of electroconductive members;

grinding the second substrate to expose the one end portion of each of the plurality of electroconductive members on a surface of the reinforcing member;

forming a metal film on the surface of the reinforcing member corresponding to each of the one end portions of the plurality of electroconductive members; and forming a bump on each of the metal films.

2. The method of manufacturing a stacked mounting structure according to claim 1, further comprising separating the stacked mounting structure to form individual modules by dicing the stacked mounting structure.

3. The method of manufacturing a stacked mounting structure according to claim 1, further comprising, subsequent to forming the bumps on each of the metal films, mounting a third substrate on the metal bumps.

* * * * *